US007026092B1

(12) United States Patent
Double et al.

(10) Patent No.: US 7,026,092 B1
(45) Date of Patent: Apr. 11, 2006

(54) THERMALLY-TRANSFERABLE POLYESTER IMAGE-PROTECTING LAYER

(75) Inventors: Julie C. Double, Ipswich (GB); Andrew Clifton, Ipswich (GB); Alan Butters, Capel St. Mary (GB)

(73) Assignee: Imperial Chemical Industries PLC, London (GB)

( * ) Notice: Subject to any disclaimer, the term of this patent is extended or adjusted under 35 U.S.C. 154(b) by 138 days.

(21) Appl. No.: 10/049,610

(22) PCT Filed: Jul. 20, 2000

(86) PCT No.: PCT/GB00/02794

§ 371 (c)(1),
(2), (4) Date: Jun. 6, 2002

(87) PCT Pub. No.: WO01/12448

PCT Pub. Date: Feb. 22, 2001

(30) Foreign Application Priority Data

Aug. 14, 1999 (GB) .................................... 9919159

(51) Int. Cl.
*G03F 7/34* (2006.01)
*G03F 7/11* (2006.01)
*B44C 1/165* (2006.01)

(52) U.S. Cl. ...................... 430/200; 430/262; 430/961; 156/230; 156/235; 428/32.6; 428/32.84; 428/32.86; 428/32.87; 428/480

(58) Field of Classification Search ................ 430/200, 430/262, 961, 10, 14; 428/480, 32.6, 32.84, 428/32.86, 32.87; 156/230, 235
See application file for complete search history.

(56) References Cited

U.S. PATENT DOCUMENTS

| | | | | |
|---|---|---|---|---|
| 4,783,375 | A * | 11/1988 | Hashimoto et al. | 428/480 |
| 5,071,502 | A * | 12/1991 | Hashimoto et al. | 156/235 |
| 5,332,713 | A | 7/1994 | Oldfield et al. | |
| 5,434,598 | A * | 7/1995 | Shimomine et al. | 428/480 |
| 5,964,976 | A * | 10/1999 | Tanaka et al. | 156/235 |
| 6,197,726 | B1 * | 3/2001 | Adkins et al. | 428/480 |
| 6,346,316 | B1 * | 2/2002 | Saito et al. | 428/480 |

FOREIGN PATENT DOCUMENTS

| | | | |
|---|---|---|---|
| EP | 0295485 | A2 | 12/1988 |
| EP | 0849092 | A1 | 6/1998 |
| EP | 0917964 | A2 | 5/1999 |
| WO | WO 98/07578 | | 2/1998 |

* cited by examiner

*Primary Examiner*—Richard L. Schilling
(74) *Attorney, Agent, or Firm*—Pillsbury Winthrop Shaw Pittman

(57) ABSTRACT

A thermal transfer medium for use in mass transfer printing comprises a substrate bearing on at least part of one surface thereof a coating of an overlay material comprising polyester having a glass transition greater than 50° C. (preferably at least 75° C.) and a molecular weight in the range 6,000 to 10,000. The overlay material combines good transfer characteristics, barrier properties and durability and is highly transparent.

18 Claims, No Drawings

THERMALLY-TRANSFERABLE POLYESTER IMAGE-PROTECTING LAYER

CROSS REFERENCE TO RELATED APPLICATIONS

This application is a national phase application based on PCT/GB00/02794, filed Jul. 20, 2000, and which further claims priority from British Application No. 9919159.5, filed Aug. 14, 1999. These applications in their entirety are incorporated herein by reference.

FIELD OF THE INVENTION

This invention relates to thermal transfer printing and concerns a thermal transfer medium, a method of making the medium, a method of forming an overlay on a receiver material and the resulting receiver material bearing an overlay.

BACKGROUND TO THE INVENTION

Dye diffusion thermal transfer printing is a well known process in which one or more thermally transferable dyes are transferred from selected areas of a dyesheet to a receiver material by localised application of heat, thereby to form an image. Full colour images can be produced in this way using dyes of the three primary colours, yellow, magenta and cyan. Mass transfer printing is another well known technique in which colorant material (commonly carbon black) is transferred from a mass transfer medium to a receiver material by localised application of heat. Mass transfer printing is generally used to print monochrome images, commonly text, bar codes etc. Dye diffusion thermal transfer printing and mass transfer printing are often used in conjunction with one another, with a common application being the printing of personalised cards such as identification cards, credit cards, driving licences etc, bearing a full colour image of the head of a person and text and/or a bar code in monochrome (usually black). Such printing is conveniently carried out using a dye sheet in the form of an elongate strip or ribbon of a heat-resistant substrate, typically polyethylene terephthalate film, carrying a plurality of similar sets of different coloured dye coats and colorant, each set comprising a panel of each dye colour (yellow, magenta and cyan) and a panel of colorant, with the panels being in the form of discrete stripes extending transverse to the length of the ribbon, and arranged in a repeated sequence along the length of the ribbon.

The resulting prints, particularly those in the form of cards, are frequently carried in plastic pouches, but plasticisers in the pouches, are a particular problem because they are generally good solvents for thermal transfer dyes. A heavily plasticised PVC pouch, for example, can extract virtually all the colour from an unprotected image. As a result it has become common practice to provide a layer of protective overlay material over prints produced in this way. The overlay makes the printed card or other material more secure by giving the image some degree of protection against abrasion and attack by plasticisers.

Overlay material is conveniently applied by thermal mass transfer, and to this end a ribbon-like dye sheet as described above conveniently also includes a panel of mass transfer overlay material in each set, downstream of the dye panels and colorant panel.

For overlay material to perform satisfactorily the material should have both good printability and good protective properties. For good printability the material should have good transfer characteristics, which require the material to fracture easily during the printing process, giving clean edges and a continuous coating of the printed overlay material. If the material does not fracture easily during printing the material instead tends to tear or rupture, producing images with jagged or ragged edges, exhibiting a phenomenon known as flashing. For good protective properties, the overlay should be flexible and durable and capable of withstanding rough treatment and hostile environments, such as elevated temperatures, particularly when carried in plastic pouches. To impart these properties, the overlay material needs to be tough and remain effectively continuous during prolonged use.

The requirements for good printability and good protective properties are difficult to reconcile in a single material.

Current commercially available overlay material achieves the transfer characteristics and durability requirements of the protective overlay by three different main routes. One method provides a thin layer of protective overlay (<1 μm quoted, but more commonly about 0.2 μm) of a very strong durable polymer, containing a high loading of a small particulate filler (U.S. Pat. No. 5,387,573). A second method uses a multi-layer overlay comprising of a layer to aid release from the dyesheet substrate; a brittle, tough, durable polymer layer which has low adhesion to the receiver material; and an adhesion promoting layer to allow the protective layer to adhere to the receiver material (U.S. Pat. No. 4,977,136). Another method uses a thick polymer layer of a very tough, durable polymer material which would normally have an unacceptable level of flashing, with a very high loading of an ultra-violet light absorbing (UVA) filler material to achieve a lightfast overlay, with a low cohesive strength to allow good transfer (WO 98/07578).

SUMMARY OF THE INVENTION

According to the present invention there is provided a thermal transfer medium comprising a substrate bearing on at least part of one surface thereof a coating layer of a thermally transferable overlay material for transfer onto a thermal transfer image formed on a receiver material, wherein the coating layer comprises polyester having a Tg greater than 50° C. and a molecular weight in the range 6,000 to 10,000.

The polyester preferably has a Tg of at least 75° C.

Suitable commercially available polyesters include Skybon ES600-H (Skybon is a Trade Mark) from S K Chemicals, which has a Tg of about 80° C. and a molecular weight of about 7,000, and Vylon GXW27 (Vylon is a Trade Mark) from Toyobo, which has a Tg of about 77° C. and a molecular weight of about 7,500. Both of these materials are hydroxyl-terminated polyester resins. The polyester thus conveniently comprises a hydroxy-terminated polyester resin. In one embodiment the polyester has a Tg of about 80° C. and a molecular weight of about 7,000 and in another the polyester has a Tg of about 77° C. and a molecular weight of about 7,500. In these embodiments the polyester may be a hydroxy-terminated polyester resin.

Mixtures of suitable polyesters may be used.

By using a polyester having Tg and molecular weight characteristics as specified, it is surprisingly found that an overlay material in the form of a single layer of material (in contrast to multi-layer overlays of the prior art) which is highly transparent and has good transfer characteristics coupled with good barrier properties and durability can be provided.

The coating suitably has a thickness in the range 0.5 to 5.0 μm, preferably 1.5 to 3.5 μm, typically 1.6 to 2.0 μm.

Various additives may optionally be included in the coating, eg to enhance or add properties in known manner. For example, filler materials such as inorganic filler eg silica ($SiO_2$), alumina ($Al_2O_3$) and titanium dioxide ($TiO_2$) can be used to lower the cohesive strength of the polymer layer to aid transfer, but also to improve durability and prevent 'blocking' (ie sticking) of the printed overlay to other materials such as card wallets. Optical brighteners (OB) eg Uvitex OB (from Ciba Geigy) (Uvitex is a Trade Mark) may be used to improve the colour of printed cards, as a tamper-proof measure in the overlay, and to aid registration in the film coating process. Ultra-violet light absorbers (UVA) eg Tinuvin (from Ciba Geigy) (Tinuvin is a Trade Mark) can be used to give protection to both the overlay to reduce yellowing, and an underlying dye diffusion print to reduce fading upon exposure to ultra-violet (UV) light.

The substrate may be any suitable heat-resistant material such as those known in the art. Suitable substrate materials include films of polyesters, polyamides, polyimides, polycarbonates, polysulphones, polypropylene and cellophane. Biaxially oriented polyester film, particularly polyethylene terephthalate (PET), is currently favoured for its properties of mechanical strength, dimensional stability and heat resistance. The substrate suitably has a thickness in the range 1 to 20 μm, preferably 2 to 10 μm, typically about 6 μm.

The thermal transfer medium preferably includes a subcoat between the substrate and coating, particularly in the form of a releasing subcoat to assist release of the coating during printing. One preferred release subcoat comprises a crosslinked acrylic coating.

The thermal transfer medium desirably includes a heat-resistant backcoat, on the side of the substrate not carrying the coating, to resist applied heat in use in known manner.

The thermal transfer medium is conveniently in the form of a ribbon for use in thermal transfer printing, comprising a substrate having on one surface thereof a plurality of repeated sequences of dye coats and mass transfer materials in the form of discrete stripes extending transverse to the length of the ribbon.

Thus in a preferred aspect the invention provides a thermal transfer medium, comprising an elongate strip of substrate materials having on one surface thereof a plurality of similar sets of thermally transferable dye coats and mass transfer layers, each set comprising a respective coat of each dye colour, yellow, magenta and cyan, and a respective mass transfer layer for colorant and overlay, each coat or layer being in the form of a discrete stripe extending transverse to the length of the substrate, with the sets arranged in a repeated sequence along the length of the substrate, wherein each overlay material mass transfer layer comprises a coating of an overlay material comprising polyester having a glass transition temperature (Tg) greater than 50° C. and a molecular weight in the range 6,000 to 10,000.

The thermal transfer medium is conveniently made by dissolving or dispersing the overlay material in a suitable solvent as is well known in the art to give a coating liquid. Suitable solvents include methyl ethyl ketone (MEK), propanone, tetrahydrofuran, toluene, cyclohexanone etc. The coating liquid is then coated on the substrate and dried in known manner eg by bar coating, blade coating, air knife coating, gravure coating, roll coating, screen coating, fountain coating, rod coating, slide coating, curtain coating, doctor coating.

In a further aspect the invention provides a method of making thermal transfer medium, comprising forming on one surface of a substrate a coating of an overlay material comprising polyester having a glass transition temperature (Tg) greater than 50° C. and a molecular weight in the range 6,000 to 10,000.

The thermal transfer medium is used in known manner for forming an overlay on a receiver material, frequently coupled with printing an image on suitable receiver material. The receiver material is typically in the form of a sheet or card of paper, cardboard, plastics material etc having a suitable image-receiving surface. The thermal transfer medium is placed in contact with the receiver material and localised heating effected to cause localised transfer of overlay material to form a protective overlay, commonly preceded by thermal transfer printing of dyes to produce a full colour image and mass transfer of colorant to produce text, a barcode etc, on the receiver material. One common use of the thermal transfer medium is in production of identification cards, typically formed on a sheet of plastics material such as polyvinyl chloride, ABS and polyester, and which may bear a full colour photograph of the head of an individual, produced by thermal transfer printing, in combination with text and/or a bar code produced by mass transfer printing of colorant, and covered with a layer of overlay material.

The invention finds particular application for use with receiver material in the form of a card of PVC with an image-receiving surface comprising vinyl chloride/vinyl acetate copolymer, and also with synthetic laminated paper receivers and voided polyester receivers.

In a further aspect the invention provides a method of forming an overlay on a receiver material, comprising superposing a thermal transfer medium in accordance with the invention and a receiver material; and applying localised heating to the thermal transfer medium to form an overlay on the receiver material.

The invention also includes within its scope the receiver material bearing an overlay produced in this way, particularly an identification card bearing a full colour image produced by thermal transfer printing and text and/or a bar code produced by mass transfer printing of colorant.

The receiver material may optionally carry a further protective overlay (of similar or different constitution to the main overlay) on the opposed face.

The invention will be further described, by way of illustration, in the following examples.

EXAMPLE 1

Comparative

A coating solution (solution A) was prepared from
Vylon GK640 30% by weight (TG=79° C./MWt.=20,000)
MEK 70% by weight A coating was applied by hand using a Meier bar to give a wet coat about 6 μm thick, onto a 6 μm thick polyester substrate base film. The base film was already coated with a heat resistant backcoat to provide protection from a thermal head during the printing process, and subcoat comprising a cross-linked acrylic system subcoat to provide release of the coating during printing. The coating was dried initially by a hair drier, then in an oven at 110° C. for 30 seconds. The dry coat thickness was about 2.8 μm.

The subcoat comprises a highly cross-linked acrylic coating in which the cross-linking is achieved by UW-curing using a combination of photoinitiators and synergists included in the subcoat composition, details of which are given below. The subcoat was coated on the polyester to give a dry coat thickness of approximately 0.5 μm. The subcoat composition, expressed as % w/w, was as follows:

| Chemical | % Composition | Manufacturer |
|---|---|---|
| MIBK | 47.02% | Alcohols LTD |
| Uvecryl E1354 | 41.88% | UCB Radcure S.A |
| Diakon MG102 | 5.98% | KDT/Distrupol |
| Irgacure 907 | 1.68% | Ciba Geigy Plastics |
| Uvecryl P101 | 1.67% | UCB Radcure S.A |
| Quantacure ITX | 0.84% | Lambson Fine Chemicals |
| Quantacure EPD | 0.84% | Lambson Fine Chemicals |
| Cyan dye | 0.08% | |

MIBK is methyl iso-butyl ketone. This is the solvent from which the subcoat layer is deposited. The solvent is evaporated from the coating before it is subjected to UV-curing. Uvecryl E1354 is a hexafunctional aromatic urethane acrylate oligomer. (Uvecryl is a Trade Mark.)

Diakon MG102 is a high molecular weight grade of poly methylmethacrylate. (Diakon is a Trade Mark.)

Irgacure 907, Uvecryl P101, Quantacure ITX & Quantacure EPD catalyse UV-curing of the Uvecryl E1354. (Irgacure, Uvecryl and Quantacure are Trade Marks.)

The resulting coating was spliced into a ribbon of dyesheet and was used to print onto a receiver comprising a card of polyvinyl chloride (PVC). The surface of the PVC card consists predominantly of a vinyl chloride/vinyl acetate copolymer (approximately 95:5 ratio, respectively). Printing was carried out using a Fargo Pro card printer (Fargo Pro is a Trade Mark) (manufactured by FARGO Electronics Incorporated).

The protective overlay was assessed for print transfer quality which showed very severe flashing and incomplete coverage of the PVC card. No cards were tested due to the unacceptable transfer characteristics.

EXAMPLE 2

Comparative

A coating solution (solution B) was prepared from

Vylon GK130 30% by weight (Tg=15° C./MWt.range=5,000–8,000) manufactured by Toyobo MEK 70% by weight A coating was applied as described in Example 1.

When the material was cut to size for splicing into a ribbon of dyesheet the samples all 'blocked' together into a clump of dyesheet, with each piece of dyesheet 'welded' to the piece above in the stack.

No cards were printed for testing.

EXAMPLE 3

A coating solution (solution C) was prepared from

Vylon GXW27 30% by weight (Tg=77° C./MWt.range=7,500)

MEK 70% by weight

A coating was applied and printed as described in Example 1. The dry coat thickness was about 2.9 μm. The protective overlay was assessed for print transfer quality. The overlay has sharp clean edges and the coating is continuous over the printed area of card.

Further cards were produced and tested for durability (Taber test and tumble test), lightfastness and wallet barrier resistance (1) and compared to currently commercially available material. In all tests performed the protective overlay is equivalent or better than currently commercially available material. Test details are given below.

EXAMPLE 4

A coating solution (solution D) was prepared from

Skybon ES600-H 30% by weight (Tg=80° C./MWt. range=7,000)

MEK 70% by weight

A coating was applied and printed as described in Example 1. The dry coat thickness was about 3.2 μm. The protective overlay was assessed for print transfer quality. The overlay has sharp clean edges and the coating is continuous over the printed area of card.

Further cards were produced and tested for durability (Taber test and tumble test), lightfastness and wallet barrier resistance (1) and compared to currently commercially available material. In all tests performed the protective overlay is equivalent or better than currently commercially available material, with the exception of lightfastness where the polymer only overlay yellowed with exposure to UV light. Further testing with the inclusion of UVAs and OBs significantly reduced the yellowing of the overlay when exposed to UV light.

EXAMPLE 5

A coating solution (solution C) was prepared from

Vylon GXW27 30% by weight (Tg=77° C./MWt.range=7,500)

MEK 70% by weight

A coating was applied as described in Example 1, spliced into a ribbon of dyesheet and printed onto a voided polyester receiver (CP15 Olmec Secure from ICI Imagedata—Olmec is a Trade Mark) using a CP 15 printer (manufactured by Mitsubishi). The dry coat thickness was about 2.9 μm. The coating was assessed for transfer quality, which appeared very good. Further prints were made and tested for wallet barrier resistance (2), dye bleed and security properties. Test details are given below. In all tests performed the protective overlay is equivalent or better than currently commercially available material, with the exception of the dye bleed test, where the protective overlay allowed slightly more dye bleed than currently commercially available material (which allows slight dye bleed).

EXAMPLE 6

A coating solution (solution D) was prepared from

Skybon ES600-H 30% by weight (Tg=80° C./MWt, range=7,000)

MEK 70% by weight

A coating was applied as described in Example 1, spliced into a ribbon of dyesheet and printed onto a voided polyester receiver (CP15 Olmec Secure) using a CP15 printer (manufactured by Mitsubishi). The dry coat thickness was about 3.2 μm. The coating was assessed for transfer quality, which appeared very good. Further prints were made and tested for wallet barrier resistance (2), dye bleed and security properties. In all tests performed the protective overlay is equivalent or better than currently commercially available material.

EXAMPLE 7

A coating solution (solution C) was prepared from

Vylon GXW27 30% by weight (Tg=77° C./MWt.range=7,500)

MEK 70% by weight

A coating was applied as described in Example 1, spliced into a ribbon of dyesheet and printed onto a laminated paper receiver (CP700 Olmec Secure from ICI Imagedata) using a CP700 printer (manufactured by Mitsubishi) fitted with an HX EPROM. The dry coat thickness was about 2.9 μm. The coating was assessed for transfer quality, which appeared very good.

EXAMPLE 8

A coating solution (solution D) was prepared from

Skybon ES600-H 30% by weight (Tg=80° C./MWt. range=7,000)

MEK 70% by weight

A coating was applied as described in Example 1, spliced into a ribbon of dyesheet and printed onto a laminated paper receiver (CP700 Olmec Secure from ICI Imagedata) using a CP700 printer (manufactured by Mitsubishi) fitted with an HX EPROM. The dry coat thickness was about 3.2 μm. The coating was assessed for transfer quality, which appeared very good.

EXAMPLE 9

A coating solution was prepared from

Vylon GXW27 25% by weight (Tg=77° C./MWt. range=7,500)

Tinuvin 326 (UV absorber-Ciba Geigy) 0.5% by weight

Uvitex OB (optical brightener-Ciba Geigy 0.13% by weight

MEK 74.37% by weight

A coating was applied and printed as described in Example 1. The dry coat thickness was about 3.1 m. The protective overlay was assessed for print transfer quality. The overlay had sharp clean edges and the coating was continuous over the printed area of the card.

Further cards were produced and tested for durability (Taber test and tumble test), lightfastness and wallet barrier resistance (1) and compared to currently commercially available material. In all tests performed the protective overlay was equivalent or better than currently commercially available material.

EXAMPLE 10

A coating solution was prepared from

Vylon GXW27 25% by weight (Tg=77° C./MWt.range=7,500)

Tinuvin 326 (UV absorber-Ciba Geigy) 0.5% by weight

Uvitex OB (optical brightener-Ciba Geigy) 0.13% by weight

Aerosil MOX80 (silica filler-Degussa) 1.25% by weight

MEK 73.12% by weight

A coating was applied and printed as described in Example 1. The dry coat thickness was about 3.1 μm. The protective overlay was assessed for print transfer quality. The overlay had sharp clean edges and the coating was continuous over the printed area of the card.

Further cards were produced and tested for durability (Taber test and tumble test), lightfastness and wallet barrier resistance (1) and compared to currently commercially available material. In all tests performed the protective overlay was equivalent or better than currently commercially available material.

EXAMPLE 11

A coating solution was prepared from.

Skybon ES600-H 25% by weight (Tg=80° C./MWt. range=7,000)

Tinuvin 326 *UV absorber-Ciba Geigy) 0.5% by weight

Uvitex OB (optical brightener-Ciba Geigy) 0.13% by weight

MEK 74.37% by weight

A coating was applied and printed as described in Example 1. The dry coat thickness was about 3.1 μm. The protective overlay was assessed for print transfer quality. The overlay had sharp clean edges and the coating was continuous over the printed area of the card.

Further cards were produced and tested for durability (Taber test and tumble test), lightfastness and wallet barrier resistance (1) and compared to currently commercially available material. In all tests performed the protective overlay was equivalent or better than currently commercially available material.

EXAMPLE 12

A coating solution was prepared from.

Skybon ES600-H 25% by weight (Tg=80° C./MWt. range=7,000)

Tinuvin 326 *UV absorber-Ciba Geigy) 0.5% by weight

Uvitex OB (optical brightener-Ciba Geigy) 0.13% by weight

Aerosil MOX80 (silica filler-Dugussa) 1.25% by weight

MEK 73.12% by weight

A coating was applied and printed as described in Example 1. The dry coat thickness was about 2.9 μm. The protective overlay was assessed for print transfer quality. The overlay had sharp clean edges and the coating was continuous over the printed area of the card.

Further cards were produced and tested for durability (Taber test and tumble test), lightfastness and wallet barrier resistance (1) and compared to currently commercially available material. In all tests performed the protective overlay was equivalent or better than currently commercially available material.

Test Methods

Durability (1)—Taber Abrasion

The object of this test is to simulate the everyday abrasive wear to the protective overlay on the PVC card surface which may be expect throughout the lifetime of the card.

After printing the card with a special optical density (OD) image designed for test purposes, with protective overlay as described in the Examples, the card is notched along the centre of the low optical density long edge of the card to allow the card to be mounted as one of a pair of test cards on the turntable of the Taber 5130 Abrader (Taber is a Trade Mark) (manufactured by Teledyne Taber) which wears down the surface of the card with two abrasive rubber wheels under a specific load, driven by the sample in opposite directions.

The other card of the test pair is printed with a currently commercially available protective overlay. The card pair is then abraded for 100 cycles using CS-10F wheels, 1 kg extra weight and a 70% vacuum level.

The performance of the development protective overlay is then be graded against the commercially available material.

Good samples will show no loss of image but the protective overlay will be scuffed; poor samples will have worn completely through to the card surface.

Durability (2)—Tumble Test

The object of this test is to simulate everyday wear of a card, including handling, flexing, heat and humidity, and abrasion.

After printing with an optical density image (as used in the Taber test) and protective overlay (as described in the Examples), cards are flexed 100 times along the length of the card (image extension) using a testing machine referred to as an AutoFlexer machine. The AutoFlexer machine comprises of a pair of jaws, one fixed the other free to move in a forwards/backwards motion. A motor drives the jaws with a movement of 12 mm and a closed gap of 41 mm with the cards flexing in the short direction (the set up may by altered to flex the cards in the long direction with a closed gap of 55 mm). The jaws can accommodate a maximum of 4 test cards. The cards are flexed at 0.5 Hz.

After applying Veriderm cream (a hand cream designed to simulate natural finger grease, manufactured by Upjohn) (Veriderm is a Trade Mark) to the imaged surface, the card is placed in a 45° C./85% RH (relative humidity) oven for 24 hours. The cards are then placed around the inside surface of a cylindrical container (with the image facing inwards) filled with a selection of nuts and bolts (to simulate pocket change, keys, etc.). The lid of the container is then sealed and the container is tumbled on a set of rollers at a speed of about 20 rpm for two hours. The cards are then removed, wiped clean of any excess grease, and graded according to the level of damage to the card surface, as compared to currently commercially available material.

Good samples will show no loss of image but the protective overlay may be scuffed; poor samples will have worn completely through to the card surface.

Wallet Barrier (1)

After printing with an optical density image (as used in the Taber test) and protective overlay (as described in the Examples), cards are flexed 100 times along the length of the card (image extension) using the AutoFlexer machine. The flexed region of the card is examined by optical microscope and a print made of any damage visible. A piece of the internal surface of a PVC card wallet (as commonly used to clip an id card to clothing) is placed over the imaged surface of the card, which is then placed under a 1.2 kg mass in a 50° C. oven for 72 hours. Unflexed cards are also tested to indicate whether any dye bleed is due to insufficient barrier properties of the protective overlay or to fracturing of the protective overlay during flexing. The samples are removed from the oven, separated and graded according to the extent of dye bleed through the protective overlay onto the PVC wallet, as compared to currently commercially available material.

Good samples will have no dye bleed on to the PVC wallet material; poor samples will show dye bleed even on unflexed cards.

Lightfastness

After printing with an optical density image (as used in the Taber Test) and protective overlay (as described in the Examples), cards are measured using a MacBeth TR 1224 densitometer (manufactured by MacBeth Division of Kollmorgen Instruments Corporation) (MacBeth is a Trade Mark). The samples are then placed in an Atlas Ci35 Fade-ometer (manufactured by Atlas Electric Devices Company) (Atlas and Fade-ometer are Trade Marks) for exposure to:—

1.5 w/$m^2$ measured at 420 nm
290 J/$m^2$ measured at 420 nm
50% RH

The cards are then re-measured and the percent optical density loss recorded, and graded for % OD loss and a visual assessment as compared to currently commercially available material.

Good samples will be visibly brighter and more vibrant, with a low % OD loss measured; poor samples will be visibly faded in conjunction with a high % OD loss measured Wallet Barrier (2)

After printing with a suitable image and protective overlay, the printed surface is placed in contact with plasticised PVC wallet material, under a 1.2 kg mass in a 45° C./85% RH oven for 15 days. The samples are removed from the oven, separated and graded according to the extent of dye bleed through the protective overlay onto the PVC wallet material, as compared to currently commercially available material. No dye should be seen to bleed onto the PVC wallet material.

Dye Bleed

The overlay was designed to protect the dye diffusion image from low molecular weight, migratable materials, resident in lamination overlay adhesives. These materials, should they enter the receiver layer, would cause the dyes to move, fuzzing out the detail in the photographs. This test assesses the effectiveness of the overlay to protect the image from the adhesive migratables.

Two prints of four passport size portraits images with protective overlay are made. An adhesive thermal indicator strip is placed on an unprinted area of the receiver, and HMSO approved laminate is placed over both the imaged area and thermal indicator strip.

Test laminates incorporating thermal indicator strips are made to verify that the lamination conditions are with 99–104° C.; then test prints are laminated.

The two prints are placed in an oven set to 80° C. for 96 hours (4 days).

To pass the test there must be no visible degradation of the image after ageing.

Security Test

A single portrait image is cut from a print of four passport sized portrait images with protective overlay, and the printed image is secured using double sided adhesive tape to a piece of paper card. HMSO approved laminate is applied over the printed image and card, having previously made test laminates incorporating thermal indicator strips to verify the lamination conditions of 99–104° C.

Once cool the laminate around the print is cut using a scalpel.

The laminate is peeled slowly back, by hand, away from the print through 180°. To pass the test the damage to the imaged surface must be such that neither the print or laminate can be re-used.

Summary of Results

Grading System 2 much better than current commercially available material
1 better than current commercially available material
0 as current commercially available material
−1 worse than current commercially available material
−2 much worse than current commercially available material

| Example Ref | Transfer | Taber | Tumble | Wallet Barrier (1) | Light fastness | Wallet Barrier (2) | Dye Bleed | Security |
|---|---|---|---|---|---|---|---|---|
| 1 | −2 | n/a | n/a | n/a | n/a | n/a | n/a | n/a |
| 2 | n/a | n/a | n/a | n/a | n/a | n/a | n/a | n/a |
| 3 | 0 | 0 | 0 | 1 | 1 | n/a | n/a | n/a |
| 4 | 0 | 0 | 0 | 1 | 1 | n/a | n/a | n/a |
| 5 | 0 | n/a | n/a | n/a | n/a | 0 | −1 | 0 |
| 6 | 0 | n/a | n/a | n/a | n/a | 0 | 1 | 0 |
| 7 | 0 | n/a | n/a | n/a | n/a | n/a | n/a | n/a |
| 8 | 0 | n/a | n/a | n/a | n/a | n/a | n/a | n/a |
| 9 | 0 | 0 | 0 | 1 | 1 | n/a | n/a | n/a |
| 10 | 0 | 0 | 0 | 1 | 1 | n/a | n/a | n/a |
| 11 | 0 | 0 | 0 | 1 | 1 | n/a | n/a | n/a |
| 12 | 0 | 0 | 0 | 1 | 1 | n/a | n/a | n/a |

The invention claimed is:

1. A thermal transfer medium comprising a substrate bearing on at least part of one surface thereof a coating layer of a thermally transferable overlay material for transfer onto a thermal transfer image formed on a receiver material, wherein the coating layer comprises a hydroxy-terminated polyester having a Tg of at least 75° C. and a molecular weight ranging from 6,000 to 10,000, and wherein a cross-linked acrylic subcoat is present between the substrate and coating.

2. A thermal transfer medium according to claim 1, wherein the polyester has a Tg of about 80° C. and a molecular weight ranging from about 7,000 to 10,000.

3. A thermal transfer medium according to claim 1, wherein the polyester has a Tg of about 77° C. and a molecular weight ranging from about 7,500 to 10,000.

4. A thermal transfer medium according to claim 1, wherein the coating further comprises filler material.

5. A thermal transfer medium according to claim 1, wherein the coating further comprises one or more ultraviolet light absorbers.

6. A thermal transfer medium according to claim 1, wherein the coating further comprises one or more optical brighteners.

7. A thermal transfer medium according to claim 1, wherein the substrate comprises a film of heat-resistant material selected from polyesters, polyamides, polyimides, polycarbonates, polysulphones, polypropylene and cellophane.

8. A thermal transfer medium according to claim 1, wherein the coating has a thickness ranging from 0.5 to 5.0 μm.

9. A thermal transfer medium according to claim 1, wherein the other surface of the substrate has a heat-resistant backcoat.

10. A thermal transfer medium, comprising an elongate strip of substrate material having on one surface thereof a plurality of similar sets of thermally transferable dye coats and mass transfer layers, each set comprising a respective coat of dye colors, yellow, magenta and cyan, and a respective mass transfer layer for colorant and overlay, each coat or layer being in the form of a discrete stripe extending transverse to the length of the substrate, wherein each overlay material mass transfer layer comprises a coating of an overlay material comprising a hydroxy-terminated polyester having a glass transition temperature (Tg) greater than 50° C. and a molecular weight ranging from 6,000 to 10,000, and wherein a cross-linked acrylic subcoat is present between the substrate and coating.

11. A method of forming an overlay on a receiver material, comprising the steps of superposing a thermal transfer medium in accordance with claim 1 and a receiver material;

applying localized heating to the thermal transfer medium to form an overlay on the receiver material.

12. A method according to claim 11, further comprising the step of producing a printed image on the receiver material by thermal transfer printing prior to formation of the overlay.

13. A method according to claim 11, wherein the receiver material comprises a card of polyvinyl chloride.

14. A method according to claim 11, wherein the receiver material has an image-receiving surface comprising vinyl chloride/vinyl acetate copolymer.

15. A method according to claim 11, wherein the receiver is in the form of an identification card bearing a full color image produced by thermal transfer printing and text and/or a bar code produced by mass transfer printing of colorant.

16. The combination of a receiver material having an image-receiving surface comprising vinyl chloride/inyl acetate copolymer and a thermal transfer medium comprising a substrate bearing on at least part of one surface thereof a coating layer of a thermally transferable overlay material for transfer onto a thermal transfer image formed on the receiver material, wherein the coating layer comprises a hydroxy-terminated polyester having a Tg greater than 50° C. and a molecular weight ranging from 6,000 to 10,000, and wherein a cross-linked acrylic subcoat is present between the substrate and coating.

17. A combination according to claim 16, wherein the receiver material comprises a card of polyvinyl chloride.

18. A method of forming an overlay on a receiver material having an image-receiving surface comprising vinyl chloride/vinyl acetate copolymer, comprising the steps of superimposing a thermal transfer medium comprising a substrate bearing on at least part of one surface thereof a coating layer of a thermally transferable overlay material for transfer onto a thermal transfer image formed on a receiver material, wherein the coating layer comprises a hydroxy-terminated polyester having a Tg greater than 50° C. and a molecular weight ranging from 6,000 to 10,000, and wherein a cross-linked acrylic subcoat is present between the substrate and coating; and applying localized heating to the thermal transfer medium to form an overlay on the receiver material.

* * * * *